(12) United States Patent
Cho et al.

(10) Patent No.: US 8,143,621 B2
(45) Date of Patent: Mar. 27, 2012

(54) ACTIVE TYPE DISPLAY DEVICE

(75) Inventors: Se-Il Cho, Suwon-si (KR); Chun-Gi You, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 83 days.

(21) Appl. No.: 11/544,088

(22) Filed: Oct. 6, 2006

(65) Prior Publication Data

US 2007/0210309 A1 Sep. 13, 2007

(30) Foreign Application Priority Data

Mar. 10, 2006 (KR) .................. 10-2006-0022603

(51) Int. Cl.
*H01L 29/04* (2006.01)

(52) U.S. Cl. .......................................... 257/59; 257/72
(58) Field of Classification Search ............ 257/59, 257/72
See application file for complete search history.

(56) References Cited

U.S. PATENT DOCUMENTS

| | | | | |
|---|---|---|---|---|
| 5,784,133 | A * | 7/1998 | Kim et al. | 349/44 |
| 6,911,669 | B2 * | 6/2005 | Lai | 257/59 |
| 2002/0155729 | A1 | 10/2002 | Baldwin et al. | |
| 2004/0195571 | A1 * | 10/2004 | Ahn et al. | 257/72 |
| 2004/0263704 | A1 | 12/2004 | Oh et al. | |
| 2004/0263746 | A1 * | 12/2004 | Cho et al. | 349/139 |
| 2005/0142704 | A1 * | 6/2005 | Oh et al. | 438/158 |
| 2005/0269562 | A1 * | 12/2005 | Yang et al. | 257/40 |

FOREIGN PATENT DOCUMENTS

| | | |
|---|---|---|
| JP | 5-226658 | 9/1993 |
| JP | 07-191347 A | 7/1995 |
| JP | 07-273332 A | 10/1995 |
| JP | 8-124939 | 5/1996 |
| JP | 10-161158 A | 6/1998 |
| JP | 10-177968 A | 6/1998 |
| JP | 11-17189 | 1/1999 |
| JP | 11-133450 A | 5/1999 |
| JP | 11-233780 | 8/1999 |
| JP | 2001-133804 | 5/2001 |
| JP | 2001-281698 | 10/2001 |
| JP | 2001-311965 A | 11/2001 |
| JP | 2001-318628 A | 11/2001 |
| JP | 2005-510064 A | 4/2005 |
| JP | 2005-340168 A | 12/2005 |

(Continued)

OTHER PUBLICATIONS

Patent Abstracts of Japan, Publication No. 05-226658, Sep. 3, 1993, 1 p.

(Continued)

*Primary Examiner* — Howard Weiss
*Assistant Examiner* — Tifney Skyles
(74) *Attorney, Agent, or Firm* — Innovation Counsel LLP

(57) ABSTRACT

The display device according to an exemplary embodiment of the present invention includes an insulation substrate, a first signal line formed on the insulation substrate, a second signal line intersecting and insulated from the first signal line, an covering member formed on the second signal line, and a switching element having a first terminal, a second terminal, and a third terminal, wherein the first terminal is connected to the first signal line and the second terminal is connected to the second signal line, and a pixel electrode is connected to the third terminal of the switching element. The covering member according to an embodiment of the present invention reduces the etching error in forming a fine pattern.

13 Claims, 17 Drawing Sheets

FOREIGN PATENT DOCUMENTS

| | | |
|---|---|---|
| JP | 2007-235102 A | 9/2007 |
| KR | 1999-0040307 | 6/1999 |
| KR | 10-2002-57239 | 7/2002 |
| KR | 10-2005-3760 | 1/2005 |
| KR | 10-2005-67745 | 7/2005 |
| KR | 10-2005-96307 | 10/2005 |
| KR | 10-2005-96748 | 10/2005 |
| KR | 10-2005-112975 | 12/2005 |
| WO | 03043094 A1 | 5/2003 |

OTHER PUBLICATIONS

Patent Abstracts of Japan, Publication No. 08-124939, May 17, 1996, 1 p.

Patent Abstracts of Japan, Publication No. 11-017189, Jan. 22, 1999, 1 p.

Patent Abstracts of Japan, Publication No. 11-233780, Aug. 27, 1999, 1 p.

Patent Abstracts of Japan, Publication No. 2001-133804, May 18, 2001, 1 p.

Patent Abstracts of Japan, Publication No. 2001-281698, Oct. 10, 2001, 1 p.

Korean Patent Abstract, Publication No. 1999-0040307, Jun. 5, 1999, 1 p.

Korean Patent Abstracts, Publication No. 10-2002-0057239 A, Jul. 11, 2002, 1 p.

Korean Patent Abstracts, Publication No. 10-2005-0003760 A, Jan. 12, 2005, 1 p.

Korean Patent Abstracts, Publication No. 10-2005-0067745 A, Jul. 5, 2005, 1 p.

Korean Patent Abstracts, Publication No. 10-2005-0096307 A, Oct. 6, 2005, 1 p.

Korean Patent Abstracts, Publication No. 10-2005-0096748 A, Oct. 6, 2005, 1 p.

Korean Patent Abstracts, Publication No. 10-2005-0112975 A, Dec. 1, 2005, 1 p.

* cited by examiner

ACTIVE TYPE DISPLAY DEVICE

CROSS-REFERENCE TO RELATED APPLICATION

This application claims priority to and the benefit of Korean Patent Application No. 10-2006-0022603 filed in the Korean Intellectual Property Office on Mar. 10, 2006, the entire contents of which are incorporated herein by reference.

BACKGROUND OF THE INVENTION

1. Field of the Invention

The present invention relates a display device and a manufacturing method therefor.

2. Description of the Related Art

An active type display device, such as an active matrix (AM) liquid crystal display (LCD) or an active matrix organic light emitting diode (OLED) display includes a plurality of pixels arranged in a matrix, switching elements and a plurality of signal lines such as gate lines and data lines for transmitting signals to the switching elements, such as thin film transistors (TFTs). The switching elements selectively transmit data signals from the data lines to the pixels for displaying images by varying the light transmittance of the liquid crystals. The pixels of an OLED display images by varying the luminance of light emission of the LEDs.

The LCD and the OLED displays include a panel having a layered structure of insulating and conductive layers-provided with TFTs, field-generating electrodes, signal lines, etc. The gate lines, data lines, and the field-generating electrodes are formed of different conductive layers separated by insulating layers. The conductive layers and the insulating layers are usually patterned by lithography and etching that includes coating, light exposure, development of a photoresist film and wet or dry etching.

However, when a metal layer for a source electrode or a drain electrode of a TFT is patterned using a photoresist film as an etching mask, the photoresist film may also be eroded, thereby eroding additional areas of the source electrode and the drain electrode. In addition, the semiconductor layer may be contaminated with by-products of the etching of the metal layer so to adversely affect the characteristics and reliability of the TFT.

SUMMARY OF THE INVENTION

The present invention reduces the unwanted effects of etching required for the fine patterning of source and drain regions. A display device embodying the present invention includes forming a gate line on an substrate, forming a gate insulating layer on the gate line, forming a semiconductor layer on the gate insulating layer, forming a metal layer on the a semiconductor layer, forming an insulator layer on the metal layer, forming a photoresist film pattern on the insulator layer, etching the insulator layer and the metal layer using the photoresist film pattern insulator layer to form a covering member, a data line and a drain electrode, forming a passivation layer on the insulation substrate, and forming a pixel electrode on the passivation layer. Dry etching may advantageously be used to pattern the insulator layer and the metal layer which may include MoW or Mo while the covering member may include silicon nitride or a silicon oxide.

DETAILED DESCRIPTION OF THE EMBODIMENTS

Figure 1:
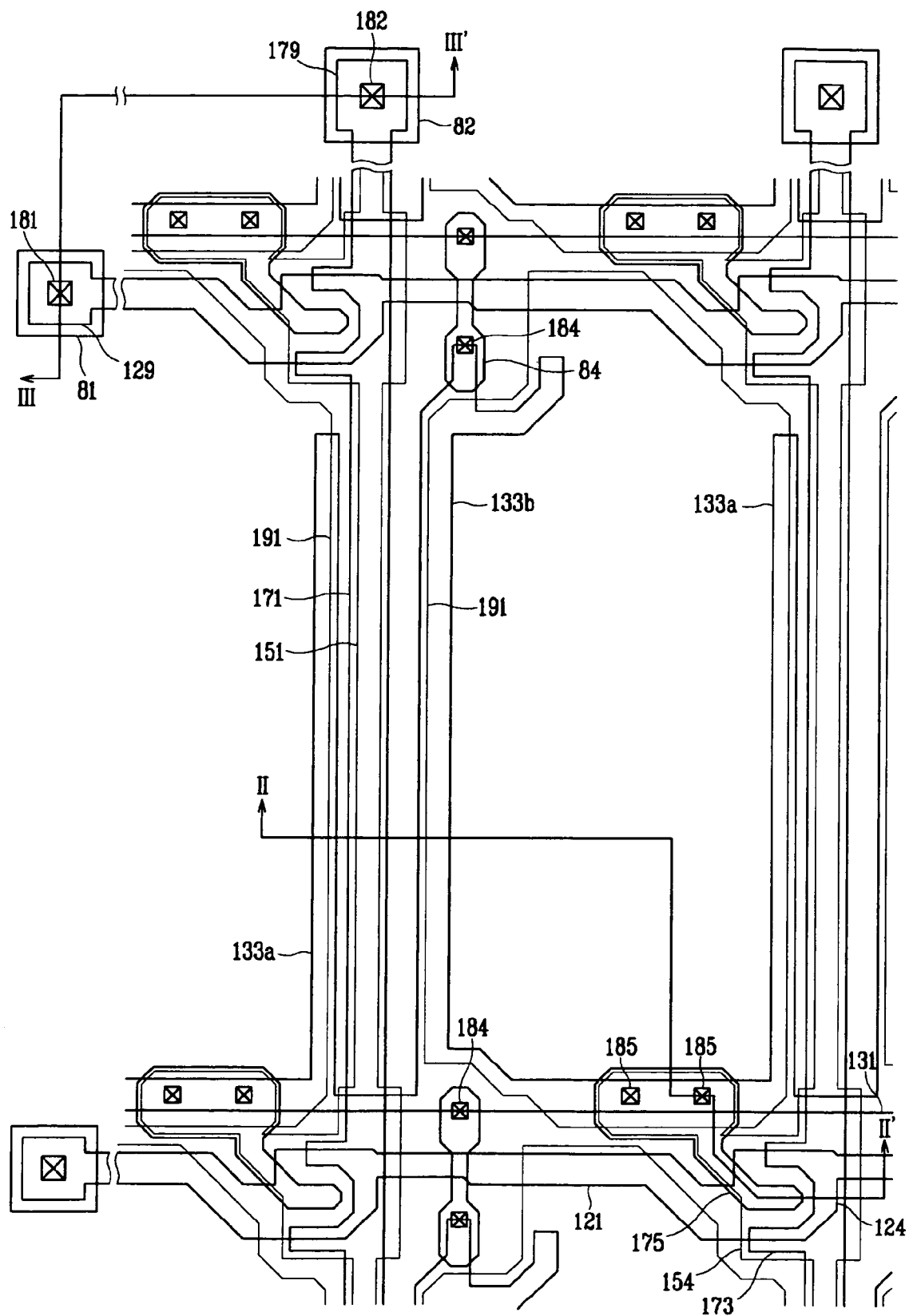
FIG. 1 is layout view of a TFT array panel according to an embodiment of the present invention.

The present invention now will be described more fully hereinafter with reference to the accompanying drawings, in which preferred embodiments of the invention are shown. As those skilled in the art would realize, the described embodiments may be modified in various different ways, all without departing from the spirit or scope of the present invention. In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
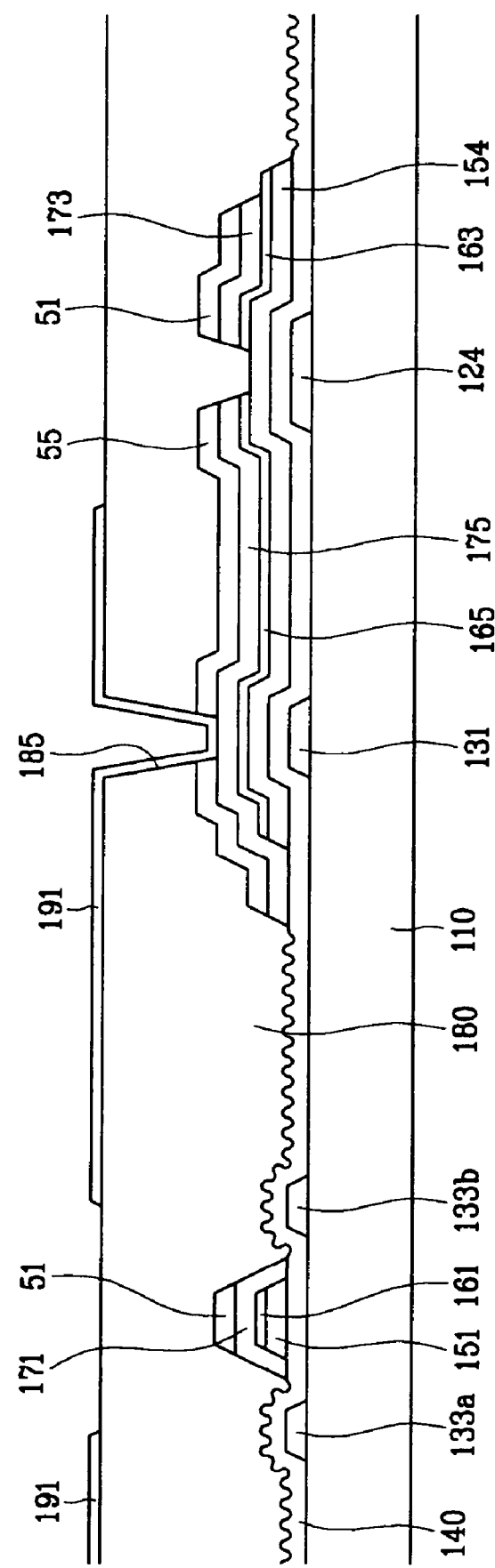
FIGS. 2 and 3 are sectional views of the TFT array panel shown in FIG. 1 taken along the lines II-II' and III-III'.
Figure 3:
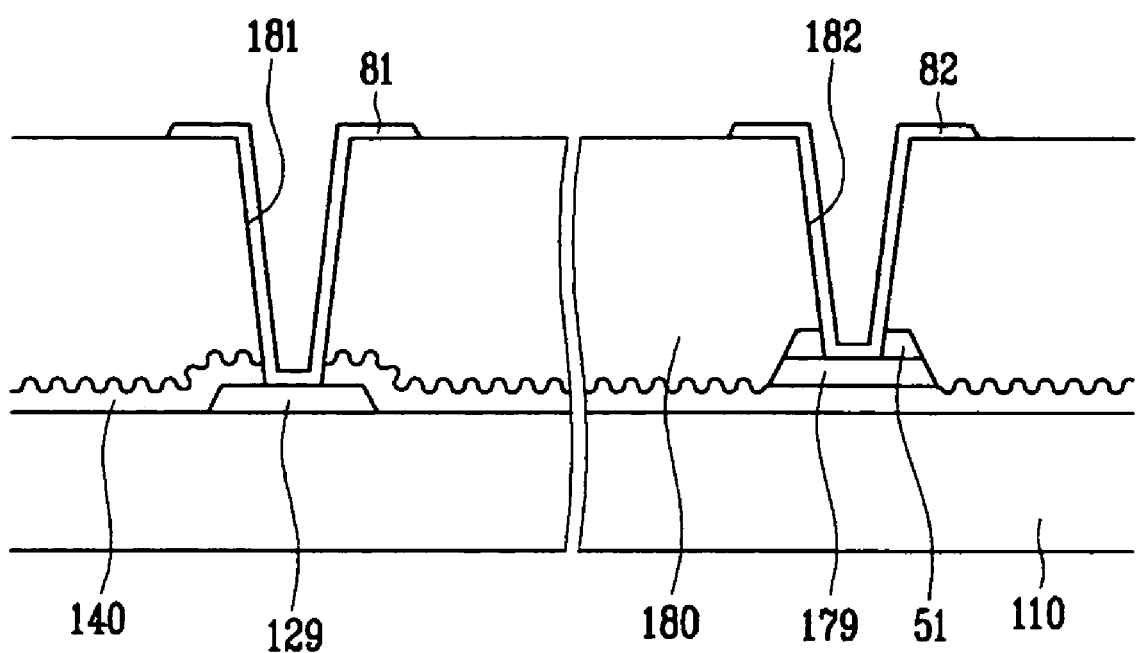

FIG. 1 is a layout view of a TFT array panel according to an embodiment of the present invention, FIG. 2 is a sectional view of the TFT array panel shown in FIG. 1 taken along line II-II', and FIG. 3 is sectional view of the TFT array panel taken along line III-III'. A plurality of gate lines 121 and a plurality of storage electrode lines 131 are formed on an insulating substrate 110 such as transparent glass or plastic.

Gate lines 121 transmit gate signals and extend substantially in a transverse direction. Each of gate lines 121 includes a plurality of gate electrodes 124 projecting downward and an end portion 129 having a large area for providing contact with another layer or an external driving circuit. A gate driving circuit (not shown) for generating the gate signals may be mounted on a flexible printed circuit (FPC) film (not shown), which may be attached to the substrate 110, directly mounted on the substrate 110, or integrated onto the substrate 110. Gate lines 121 may extend to be connected to a driving circuit that may be integrated on the substrate 110.

Each of storage electrode lines 131 includes a stem extending substantially parallel to gate lines 121 and a plurality of pairs of first and second storage electrodes 133a and 133b that branch from the stem. Each of the storage electrode lines 131 is disposed between two adjacent gate lines 121, and the stem is close to one of the two adjacent gate lines 121. Each of the storage electrodes 133a and 133b has a fixed end portion connected to the stem and a free end portion disposed opposite thereto. The fixed end portion of the first storage electrode 133b has a large area and the free end portion thereof is advantageously bifurcated into a linear branch and a curved branch. However, the storage electrode lines 131 may have various shapes and arrangements.

Gate lines 121 and storage electrode lines 131 may be made of an Al-containing metal such as Al and an Al alloy, a Ag-containing metal such as Ag and Ag alloy, a Cu-containing metal such as Cu and Cu alloy, a Mo-containing metal such as Mo and Mo alloy, Cr, Ta, or Ti. However, they may have a multi-layered structure including two conductive films (not shown) having different physical characteristics. One of the two films may be made of a low resistivity metal including an Al-containing metal, a Ag-containing metal, and a Cu-containing metal for reducing signal delay or voltage drop. The other film may be made of a material such as a Mo-containing metal, Cr, Ta, or Ti, which has good physical, chemical, and electrical contact characteristics with other materials such as indium tin oxide (ITO) or indium zinc oxide (IZO). Good examples of the combination of the two films are a lower Cr film and an upper Al (alloy) film, and a lower Al (alloy) film and an upper Mo (alloy) film. However, gate lines 121 and the storage electrode lines 131 may be made of various metals or conductors. The lateral sides of gate lines 121 and the storage electrode lines 131 are inclined relative to a surface of the substrate 110, and the inclination angle thereof ranges from about 30 to 80 degrees.

A gate insulating layer 140 preferably made of silicon nitride (SiNx) or silicon oxide (SiOx) is formed on gate lines 121 and the storage electrode lines 131. The gate insulating layer 140 may have a rough surface.

A plurality of semiconductor stripes 151 preferably made of hydrogenated amorphous silicon (abbreviated to "a-Si") or polysilicon are formed on the gate insulating layer 140. Each of the semiconductor stripes 151 extends substantially in the longitudinal direction and includes a plurality of projections 154 branched out toward the gate electrodes 124. The semiconductor stripes 151 become wide near gate lines 121 and storage electrode lines 131 such that the semiconductor stripes 151 cover large areas of gate lines 121 and storage electrode lines 131.

A plurality of ohmic contact stripes and islands 161 and 165 are formed on semiconductor stripes 151. Ohmic contacts 163 and 165 are preferably made of n+ hydrogenated a-Si heavily doped with an n-type impurity such as phosphorous, or they may be made of silicide. Each of the ohmic contact stripes 161 includes a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are inclined relative to the surface of the substrate 110, and the inclination angles thereof are preferably in a range of about 30 to 80 degrees.

A plurality of data lines 171 and a plurality of drain electrodes 175 are formed on the ohmic contacts 161 and 165 and the gate insulating layer 140. Data lines 171 transmit data signals and extend substantially in the longitudinal direction to intersect gate lines 121. Each of data lines 171 also intersects the storage electrode lines 131 and runs between adjacent pairs of storage electrodes 133a and 133b. Each data line 171 includes a plurality of source electrodes 173 projecting toward the gate electrodes 124, and an end portion 179 having a large area for making contact with another layer or an external driving circuit. A data driving circuit (not shown) for generating the data signals may be mounted on a FPC film (not shown), which may be attached to the substrate 110, directly mounted on the substrate 110, or integrated onto the substrate 110. The data lines 171 may extend to be connected to a driving circuit that may be integrated on the substrate 110.

The drain electrodes 175 are separated from the data lines 171, and are disposed opposite the source electrodes 173 with respect to the gate electrodes 124. Each of the drain electrodes 175 includes a wide end portion and a narrow end portion. The wide end portion overlaps a storage electrode line 131 and the narrow end portion is partly enclosed by a source electrode 173.

A gate electrode 124, a source electrode 173, and a drain electrode 175 along with a projection 154 of a semiconductor stripe 151 form a TFT having a channel in the projection 154 disposed between the source electrode 173 and the drain electrode 175.

Data lines 171 and the drain electrodes 175 may be made of a metal such as Cu, Mo, Cr, Ni, Co, Ta, Ti, or alloys thereof. However, they may have a multilayered structure including a metal film (not shown) and a low resistivity conductive film (not shown). Good examples of the multi-layered structure are a double-layered structure including a lower Cr/Mo (alloy) film and an upper Al (alloy) film, and a triple-layered structure of a lower Mo (alloy) film, an intermediate Al (alloy) film, and an upper Mo (alloy) film. However, the data lines 171 and the drain electrodes 175 may be made of various metals or conductors. Data lines 171 and the drain electrodes 175 have inclined edge profiles, and the inclination angles thereof range from about 30 to 80 degrees.

Ohmic contacts 161 and 165 are interposed only between the underlying semiconductor stripes 151 and the overlying conductors 171 and 175 thereon, and reduce the contact resistance therebetween. Although the semiconductor stripes 151 are narrower than the data lines 171 at most places, the width of the semiconductor stripes 151 becomes large near gate lines 121 and the storage electrode lines 131 as described above, to smooth the profile of the surface, thereby preventing the disconnection of the data lines 171. However, the semiconductor stripes 151 include some exposed portions, which are not covered with the data lines 171 and the drain electrodes 175, such as portions located between the source electrodes 173 and the drain electrodes 175.

A plurality of cover layers 51 and 55 (sometimes hereinafter referred to as "covers") are formed on the data lines 171 and the drain electrodes 175. The cover layers 51 and 55 may be made of silicon nitride or silicon oxide. Cover layers 51 and 55 generally have substantially the same planar shape as the data lines 171 and the drain electrodes 175 except that they have a plurality of through holes exposing the data lines 171 and the drain electrodes 175.

A passivation layer 180 is formed on the data lines 171, the drain electrodes 175, and the exposed portions of the semiconductor stripes 151. The passivation layer 180 may be made of an inorganic or organic insulator such as silicon nitride and silicon oxide, an organic insulator, or a low dielectric insulator, and it may have a flat top surface. The inorganic insulator and the organic insulator may have a dielectric constant of less than about 4.0. Examples of the low dielectric insulator include a-Si:C:O and a-Si:O:F formed by plasma enhanced chemical vapor deposition (PECVD). The organic insulator may have photosensitivity.

The passivation layer 180 may include a lower film of an inorganic insulator and an upper film of an organic insulator, such that it takes the excellent insulating characteristics of the organic insulator while preventing the exposed portions of the semiconductor stripes 151 from being damaged by the organic insulator.

The passivation layer 180 has a plurality of contact holes 182 and 185 exposing the end portions 179 of the data lines 171 and the drain electrodes 175, respectively. The contact holes 182 and 185 are connected to the through holes of the covers 51 and 53, and the through holes of the covers 51 and 53 will be considered as parts of the contact holes 182 and 185 hereinafter.

The passivation layer 180 and the gate insulating layer 140 have a plurality of contact holes 181 exposing the end portions 129 of gate lines 121 and a plurality of contact holes 184 exposing portions near the fixed end portions of the storage electrode 133a and 133b or portions of the free end portions of the storage electrode lines 131 of the free end portions of the storage electrode lines 131.

A plurality of pixel electrodes 191, a plurality of overpasses 84, and a plurality of contact assistants 81 and 82 are formed on the passivation layer 180. They are preferably made of a transparent conductor such as ITO or IZO or a reflective conductor such as Ag, Al, or alloys thereof.

The pixel electrodes 191 are physically and electrically connected to the drain electrodes 175 through the contact holes 185 such that the pixel electrodes 191 receive data voltages from the drain electrodes 175. The pixel electrodes 191 supplied with the data voltages generate electric fields in cooperation with a common electrode (not shown) of an opposing display panel (not shown) supplied with a common voltage, which determine the orientations of liquid crystal molecules (not shown) of a liquid crystal layer (not shown) disposed between the two electrodes. A pixel electrode 191 and the common electrode form a capacitor referred to as a "liquid crystal capacitor," which stores applied voltages after the TFT is turned off.

Pixel electrode 191 overlaps a storage electrode line 131 including storage electrodes 133a and 133b. The pixel electrode 191, a drain electrode 175 connected thereto, and the storage electrode line 131 form an additional capacitor referred to as a "storage capacitor," which enhances the voltage storing capacity of the liquid crystal capacitor.

The contact assistants 81 and 82 are connected to the end portions 129 of gate lines 121 and the end portions 179 of the data lines 171 through the contact holes 181 and 182, respectively. The contact assistants 81 and 82 protect the end portions 129 and 179 and enhance the adhesion between the end portions 129 and 179 and external devices.

The overpasses 84 cross over gate lines 121, and are connected to the exposed portions of the storage electrode lines 131 and the exposed linear branches of the free end portions of the storage electrodes 133b through a pair of the contact holes 183a and 183b, respectively, which are disposed opposite each other with respect to gate lines 121. The storage electrode lines 131 including the storage electrodes 133a and 133b along with the overpasses 83 can be used for repairing defects in gate lines 121, the data lines 171, or the TFTs.

Figure 9:
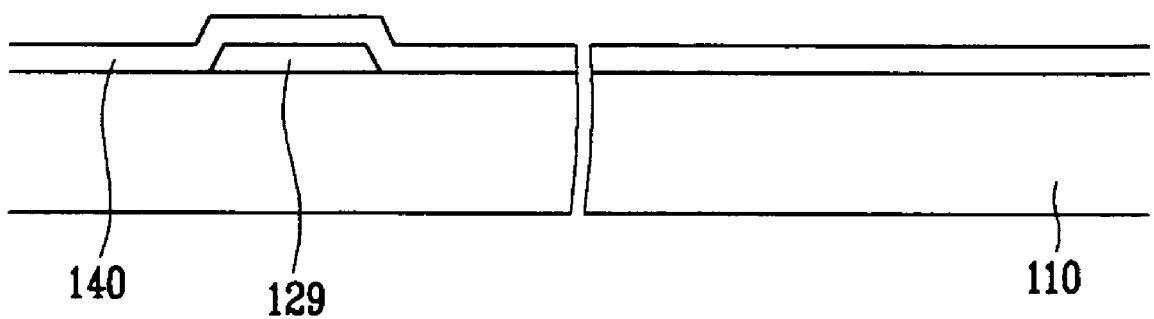
Figure 10:
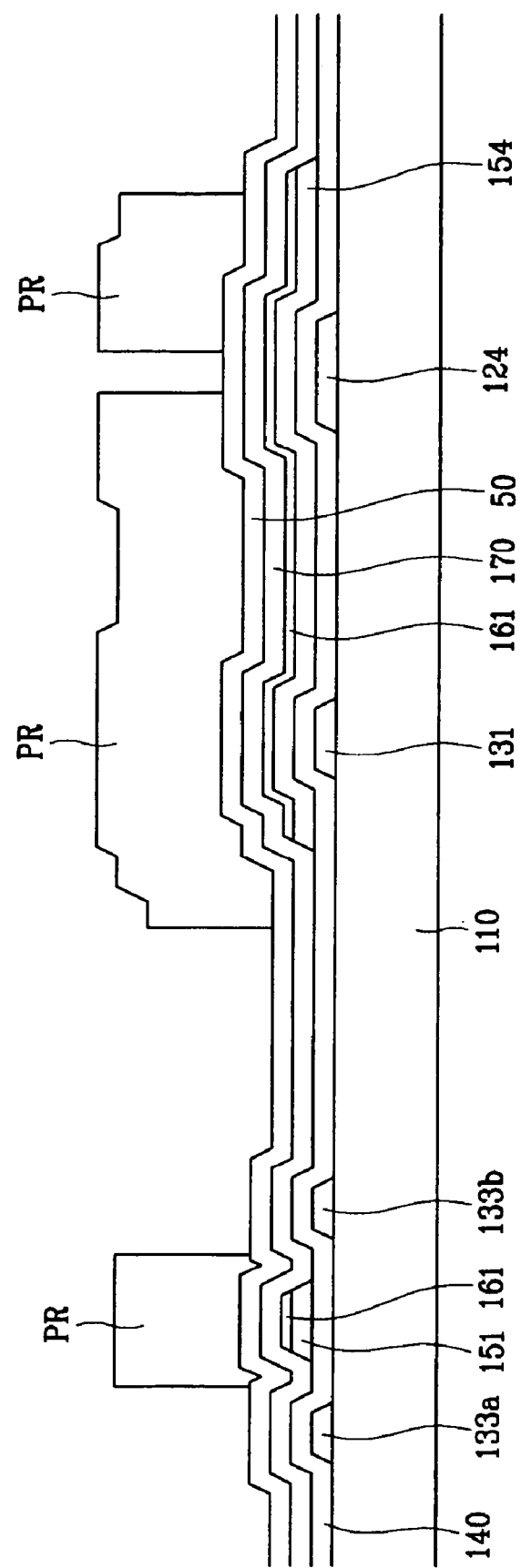
FIGS. 10 and 11 are sectional views sequentially showing a manufacturing method of a TFT array panel according to an embodiment of the present invention.
Figure 11:
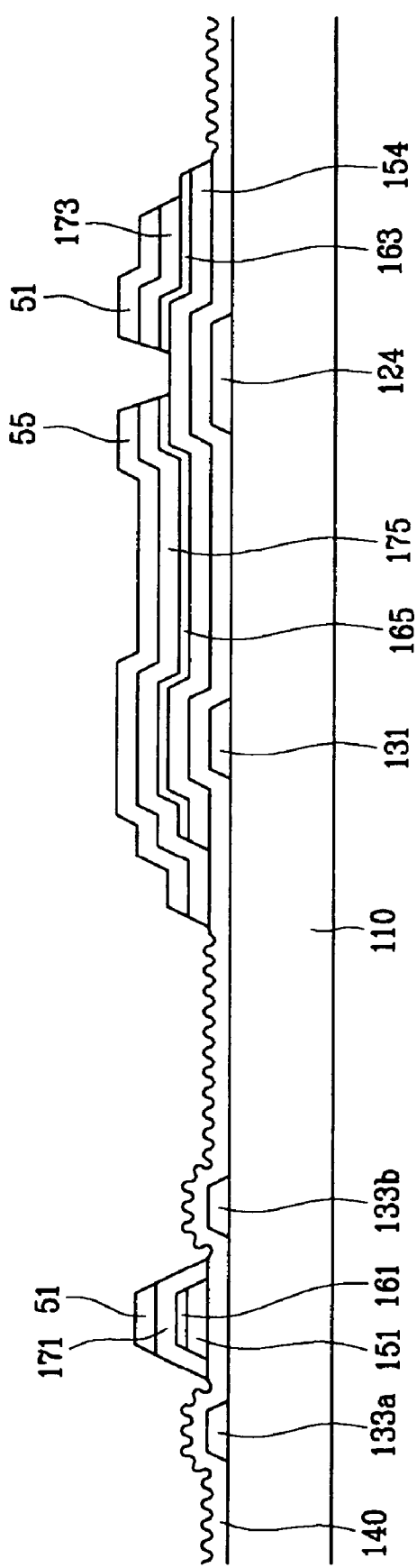
Figure 13:
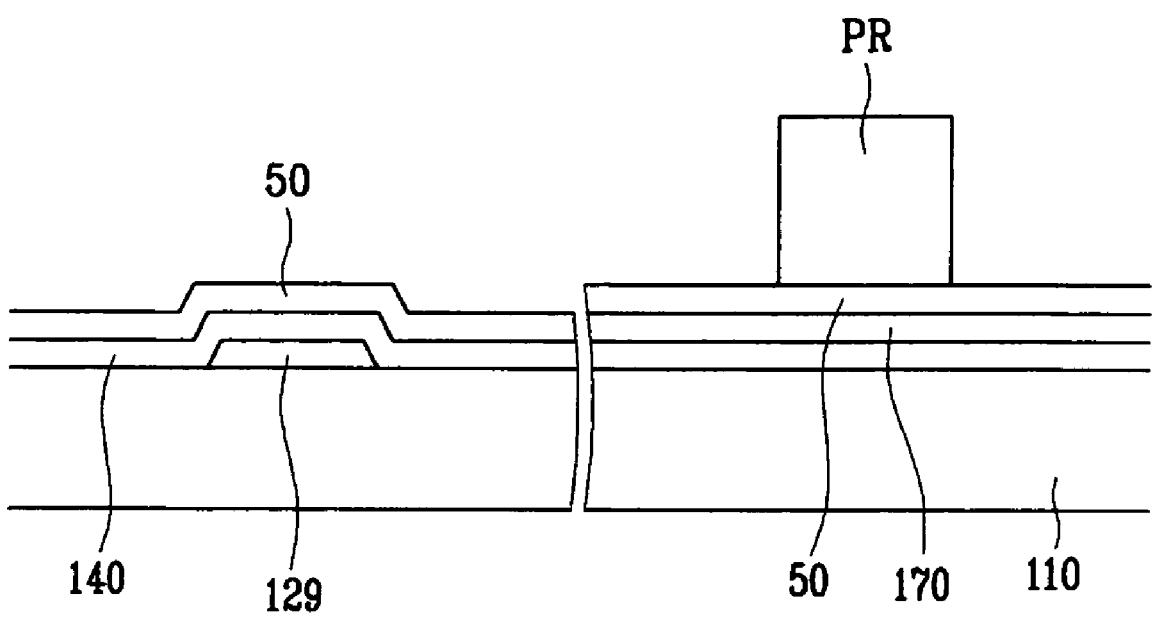
FIGS. 13 and 14 are sectional views of the TFT array panel shown in FIG. 12 taken along the lines XIII-XIII' and XIV-XIV'.
Figure 14:
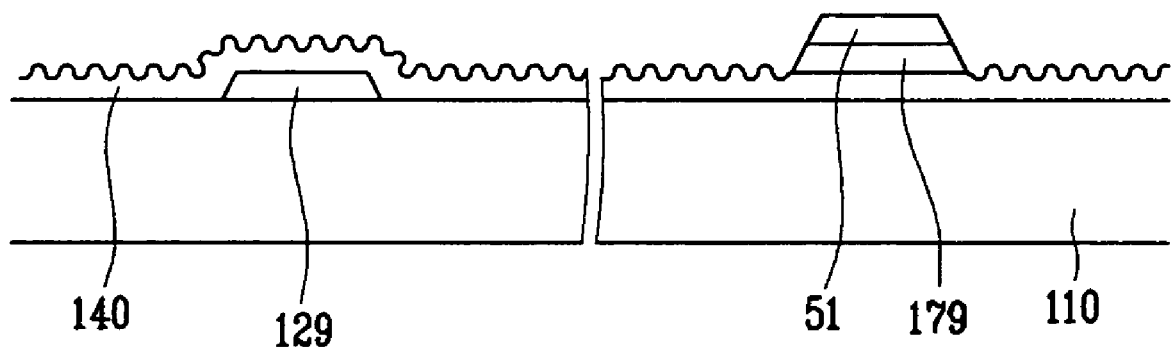
Figure 16:
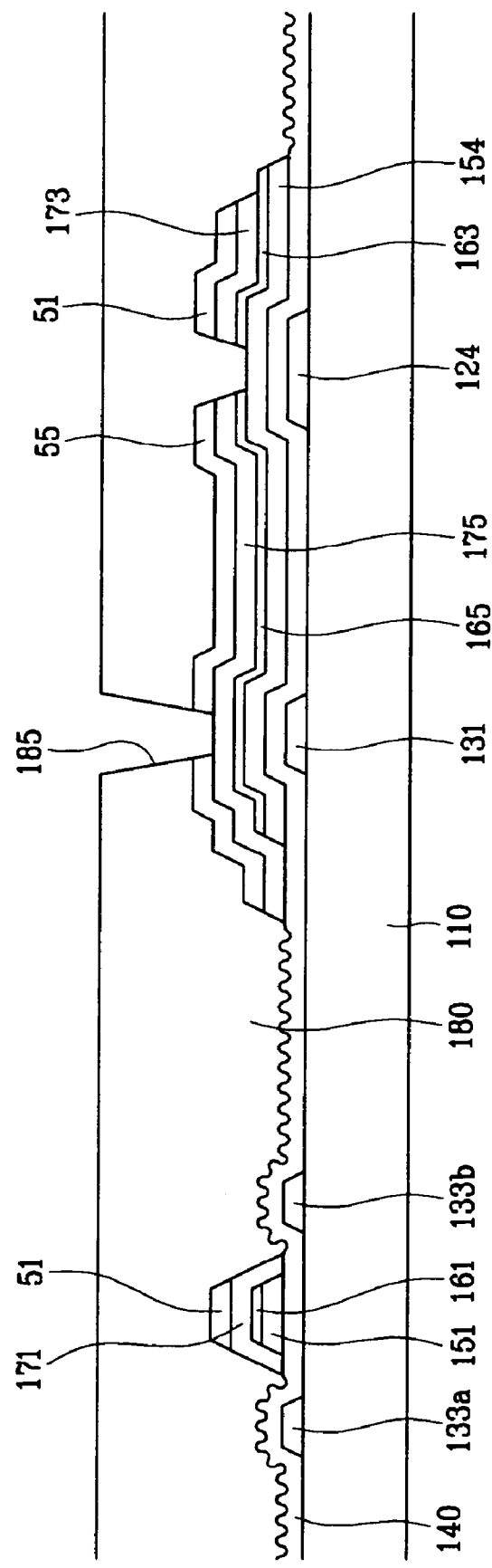
FIGS. 16 and 17 are sectional views of the TFT array panel shown in FIG. 4 taken along the lines XVI-XVI' and XVII-XVII'.
Figure 17:
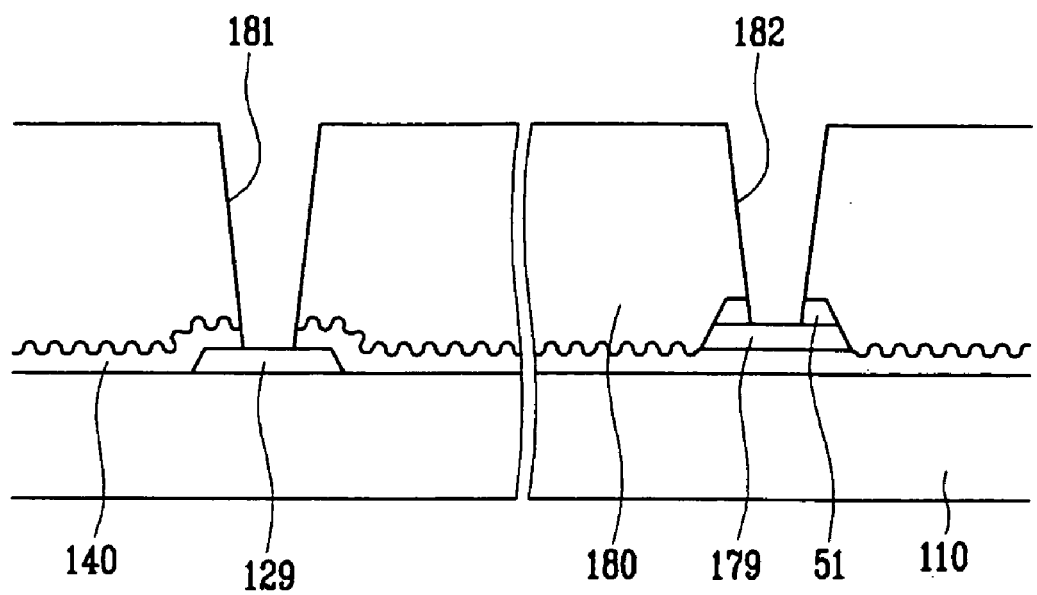

FIGS. 4, 7, 12, and 15 are layout views of an embodiment of a TFT array panel shown in intermediate steps of manufacturing according to the present invention. FIGS. 5 and 6 are sectional views of the TFT array panel shown in FIG. 4 taken along the lines V-V' and VI-VI', FIGS. 8 and 9 are sectional views of the TFT array panel shown in FIG. 7 taken along the lines VIII-VIII' and IX-IX', FIGS. 10 and 11 are sectional views sequentially showing a manufacturing method of a TFT array panel according to an embodiment of the present invention, FIGS. 13 and 14 are sectional views of the TFT array panel shown in FIG. 10 taken along the lines XIII-XIII' and XIV-XIV', and FIGS. 16 and 17 are sectional views of the TFT array panel shown in FIG. 4 taken along the lines XVI-XVI' and XVII-XVII'.

Figure 4:
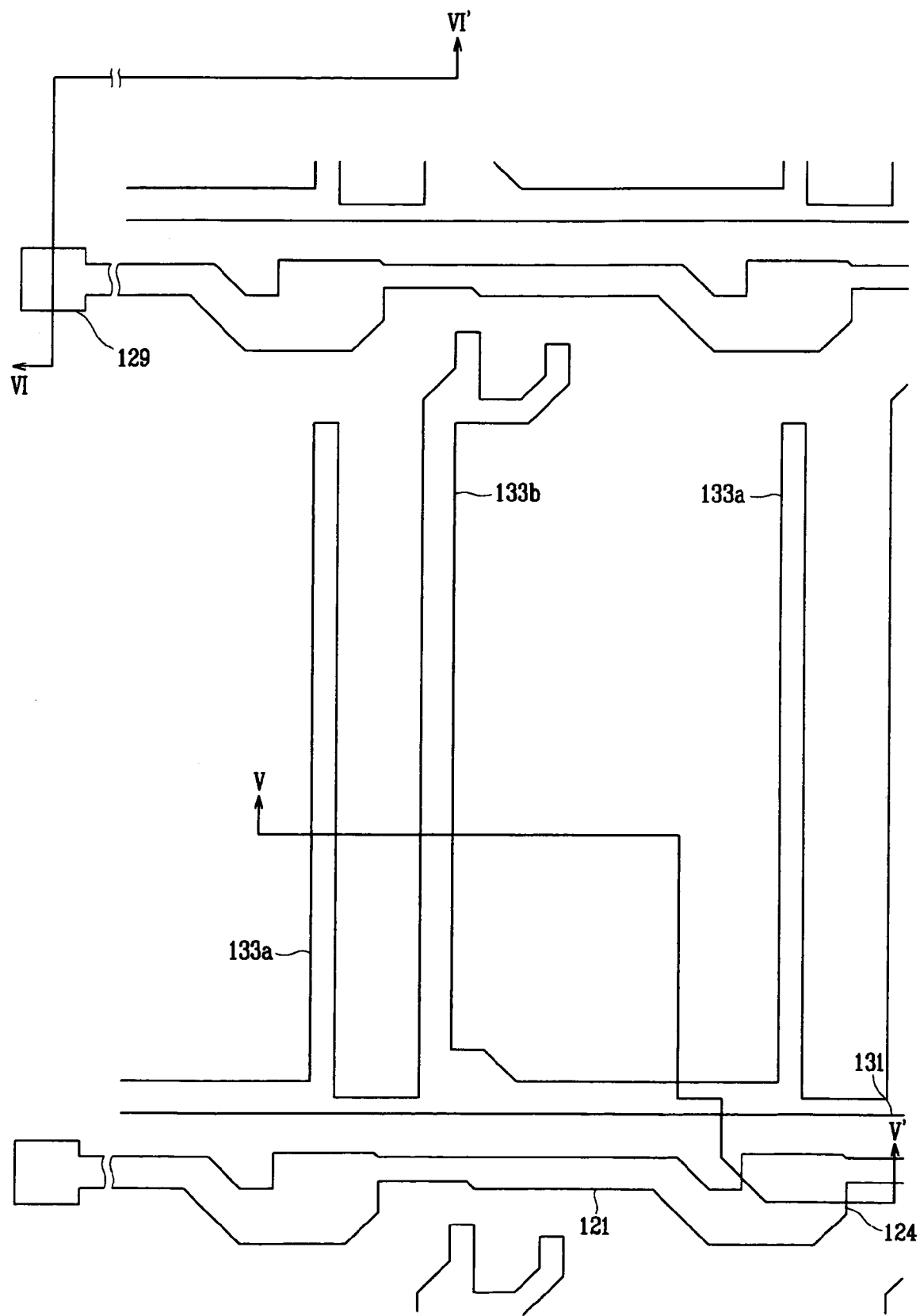
FIGS. 4, 7, 12, and 15 are layout views of the TFT array panel in intermediate steps of a manufacturing method thereof according to an embodiment of the present invention.
Figure 5:
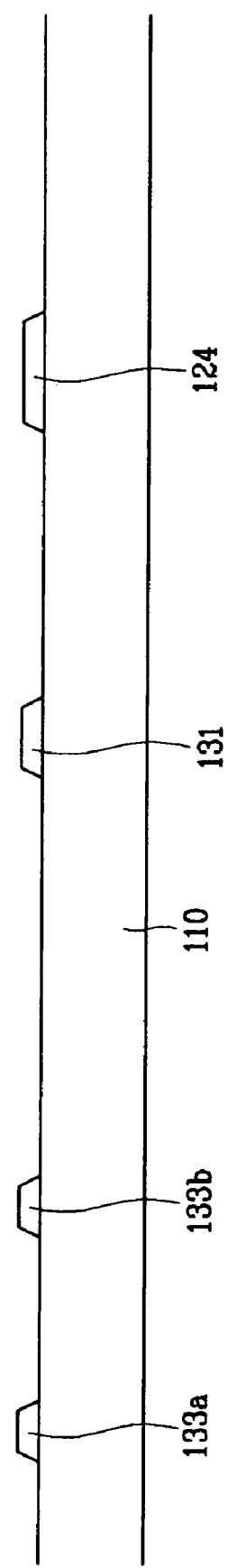
FIGS. 5 and 6 are sectional views of the TFT array panel shown in FIG. 4 taken along the lines V-V' and VI-VI'.
Figure 6:
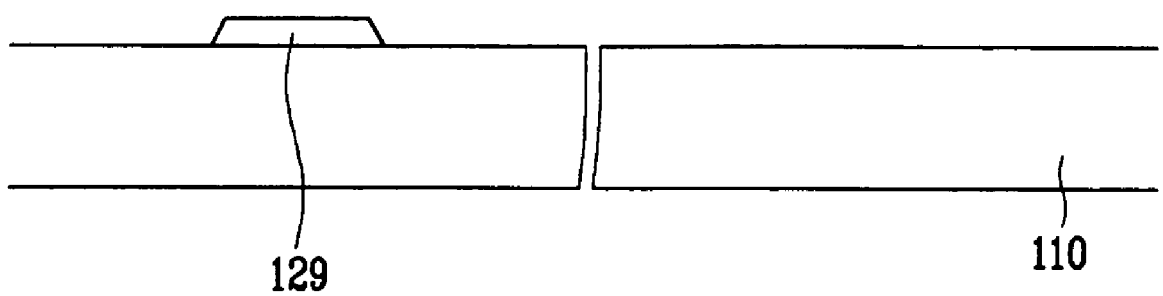

Referring to FIGS. 4 to 6, a metal film is deposited on an insulating substrate 110, and then the metal film is patterned by photolithography and etching to form a plurality of gate lines 121 including gate electrodes 124 and end portions 129 and a plurality of storage electrode lines 131 including storage electrodes 133a and 133b.

Figure 7:
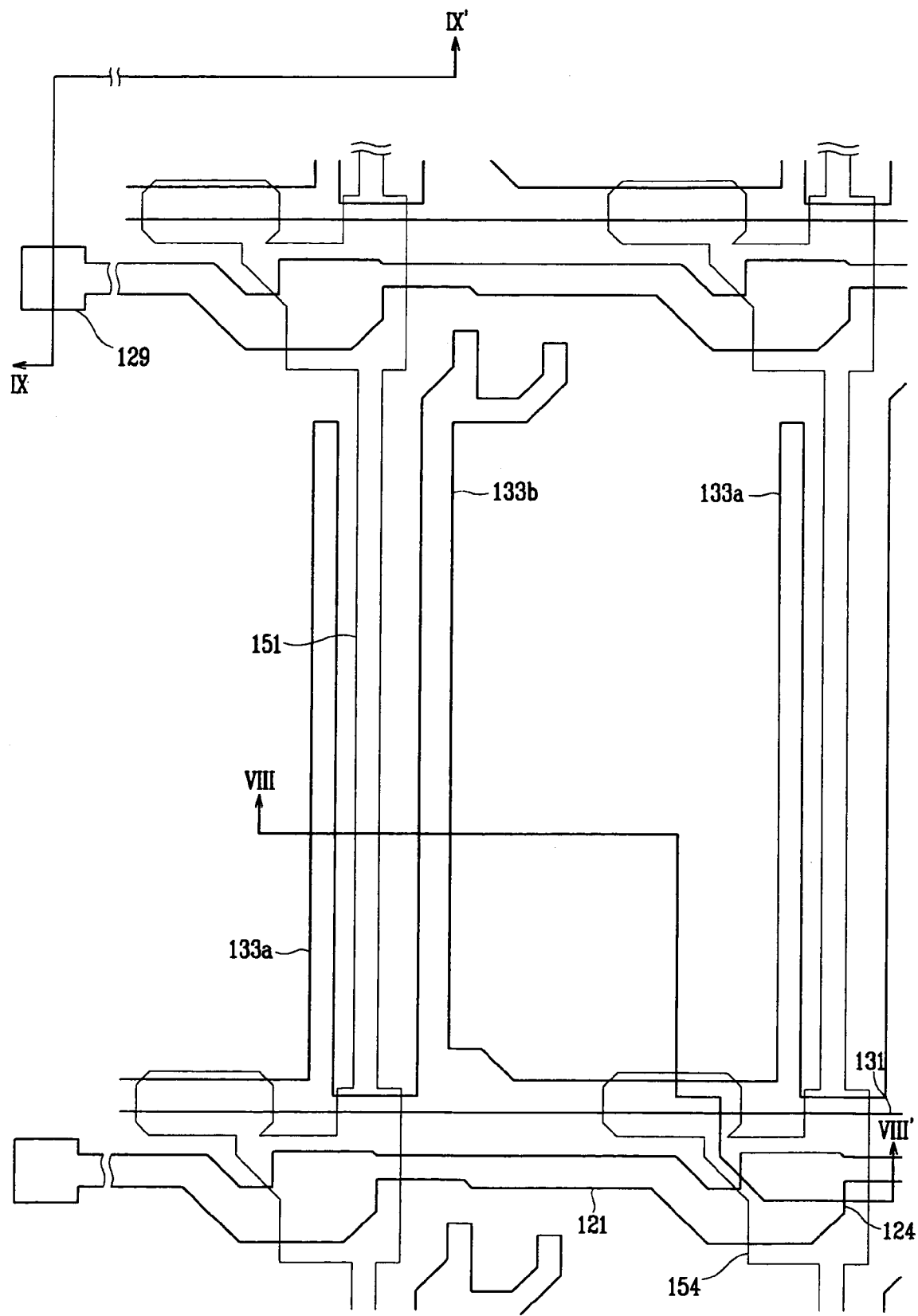
Figure 8:
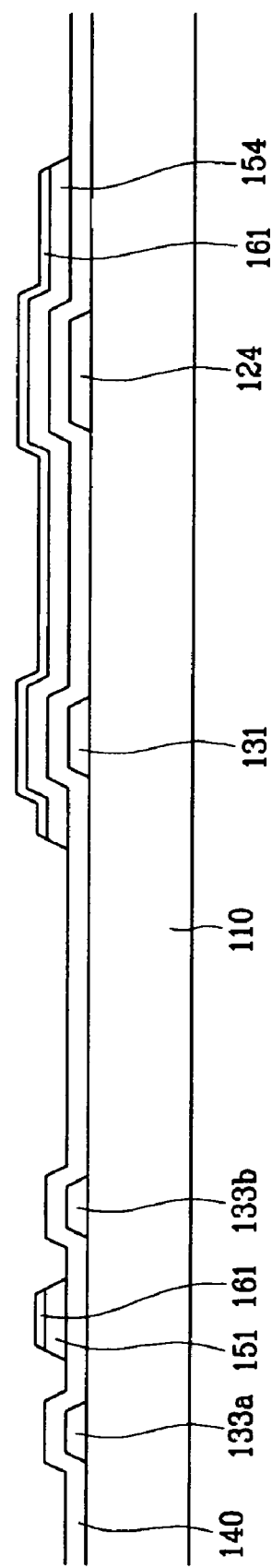
FIGS. 8 and 9 are sectional views of the TFT array panel shown in FIG. 7 taken along the lines VIII-VIII' and IX-IX'.

As shown in FIGS. 7 and 8, a gate insulating layer 140, an intrinsic a-Si layer, and an extrinsic a-Si layer are sequentially deposited on the gate lines 121 and the storage electrode lines 131 by PECVD, etc. Next, the extrinsic a-Si layer and the intrinsic a-Si layer are patterned by photolithography and etching to form a plurality of extrinsic semiconductor stripes 164 and a plurality of (intrinsic) semiconductor stripes 151 including projections 154.

A metal layer 170 made of a metal such as Mo and MoW is deposited on the extrinsic a-Si patterns 151 and 154 and the gate insulating layer 140. Sequentially, a silicon nitride layer 50 is deposited on the data layer 170. Next, a photoresist mask PR is formed on the silicon nitride layer 50 shown in FIGS. 10 and 12.

Figure 12:
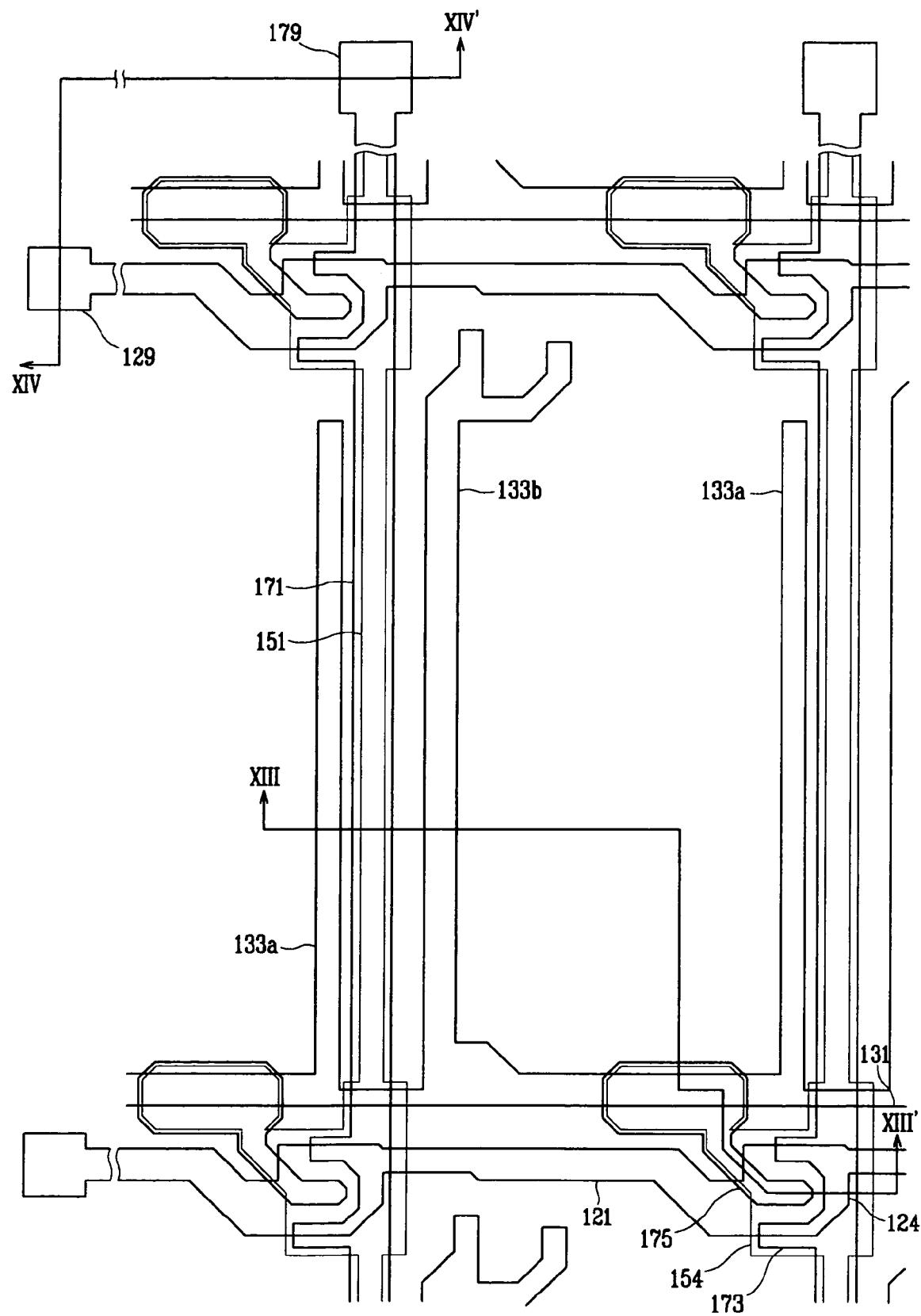

Referring to FIGS. 12 and 14, the silicon nitride layer 50 and the data layer 170 are dry-etched using the photoresist patterns RP to form a plurality of cover layers 51 and 55, a plurality of data lines 171 and 179 and a plurality of drain electrodes 175. The dry etching may roughen the exposed surface of the gate insulating layer 140 and may deform the photoresist masks PR, the silicon nitride layer 50 disposed on the metal layer 170 can reduce the deformation of the data lines 171 and the drain electrodes 175 caused by the deformation of the photoresist mask PR. Thereafter, exposed portions of the extrinsic semiconductor stripes 154, which are not covered with the data lines 171 and the drain electrodes 175, are removed to complete a plurality of ohmic contact stripes 161 including projections 163 and a plurality of ohmic contact islands 165 and to expose portions of the intrinsic semiconductor stripes 151. Oxygen plasma treatment preferably follows in order to stabilize the exposed surfaces of the semiconductor stripes 151.

Figure 15:
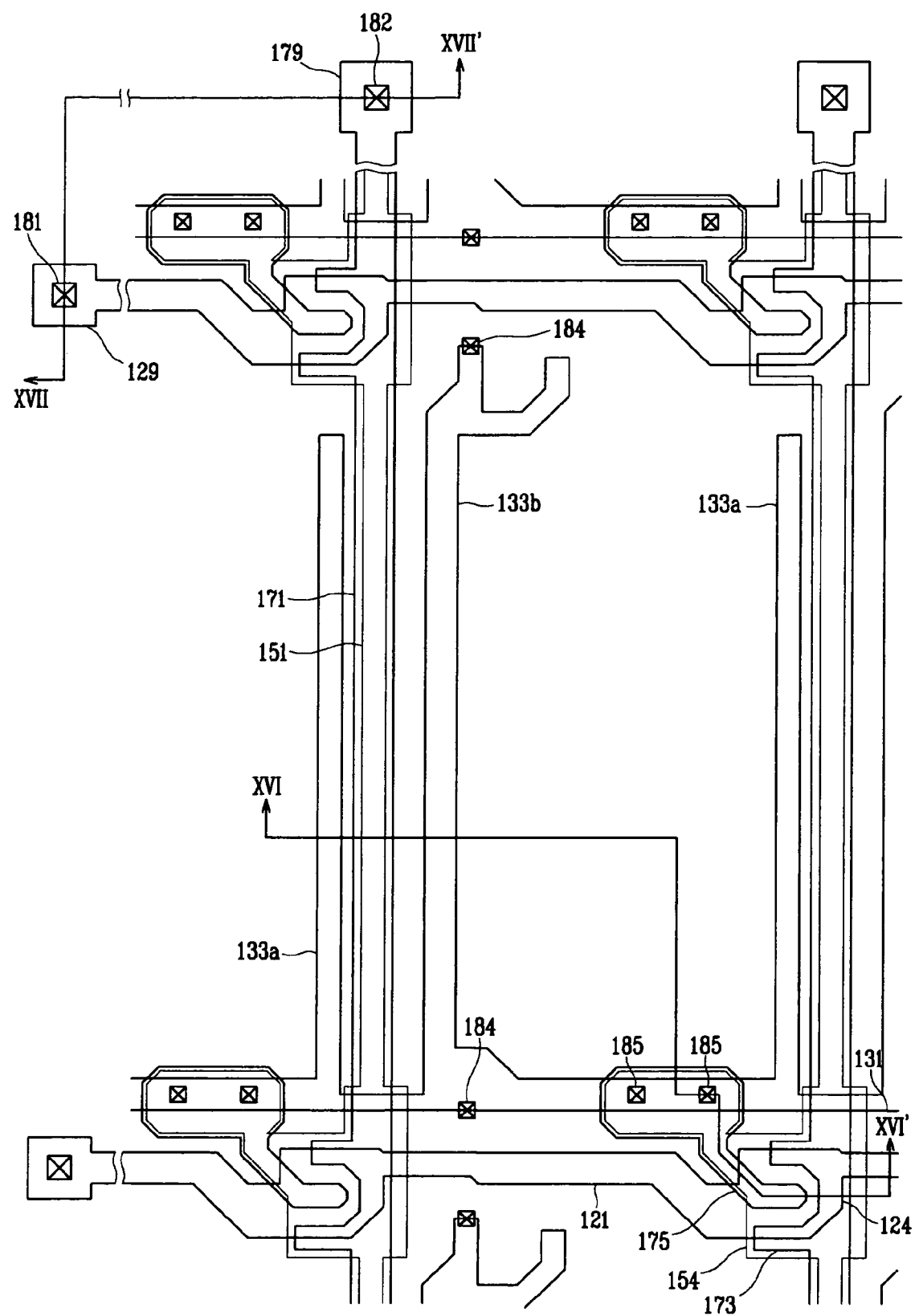

Referring to FIGS. 13 to 15, a passivation layer 180 is deposited over cover layers 51 and 55. Here, the exposed surface of the gate insulating layer 140 is rough, and accordingly a contact area between the gate insulating layer 140 and the passivation layer 180 is made larger to improve adhesion.

Sequentially, the passivation layer 180 is patterned by photolithography (and etch) to form a plurality of contact holes 181, 182, 184, and 185.

Finally, as shown in FIGS. 1 to 3, a transparent conducting material such ITO or IZO is deposited on the passivation layer 180 by sputtering, etc., and is patterned to form a plurality of pixel electrodes 191, a plurality of contact assistants 81 and 82, and a plurality of overpasses 84.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A display device comprising:
a substrate;
a first signal line formed on the substrate;
a second signal line intersecting and insulated from the first signal line;
a covering member formed on the second signal line;
a switching element having a first terminal connected to the first signal line, a second terminal connected to the second signal line, and a third terminal; and
a pixel electrode connected to the third terminal of the switching element, wherein the covering member is disposed only on regions corresponding to the second signal line, the second terminal, and the third terminal.

2. The display device of claim 1, wherein the covering member comprises an insulator.

3. The display device of claim 2, wherein the covering member comprises silicon nitride or a silicon oxide.

4. The display device of claim 2, wherein the covering member has a hole exposing the second signal line.

5. The display device of claim 1, further comprising
a gate insulating layer insulating the first signal line and the second signal line, wherein the switching element comprises a semiconductor electrically connected to the second terminal and the third terminal, the gate insulating layer comprises a first portion and a second portion, the first portion of the gate insulating layer is not covered with the semiconductor, the second terminal, the third terminal, and the second signal line; the second portion of the gate insulating layer is covered with the semiconductor, the second terminal, the third terminal, and the second signal line, and the first portion of the gate insulating layer has a surface roughness greater than a surface roughness of the second portion of the gate insulating layer.

6. A display device comprising:
a substrate;
a gate electrode formed on the substrate;
a gate insulating layer formed on the gate electrode;
a semiconductor layer formed on the gate insulating layer;
a source electrode connected to a data line and a drain electrode formed on the semiconductor layer;
a covering member formed on the source electrode and the drain electrode;
a passivation layer formed on the covering member; and
a pixel electrode formed on the passivation layer,
wherein the covering member is disposed only on regions corresponding to the data line, source electrode and the drain electrode.

7. The display device of claim 6, wherein the gate insulating layer comprises a first portion and a second portion, the first portion of the gate insulating layer is not covered with the semiconductor, the second terminal, the third terminal; and the second signal line, the second portion of the gate insulating layer is covered with the semiconductor, the second terminal, the third terminal, and the second signal line, and
the first portion of the gate insulating layer has a surface roughness greater than a surface roughness of the second portion of the gate insulating layer.

8. The display device of claim 6, wherein the covering member comprises an insulator.

9. The display device of claim 8, wherein the covering member comprises silicon nitride or a silicon oxide.

10. The display device of claim 6, wherein the covering member has a hole exposing the second signal line.

11. The display device of claim 6, wherein the passivation layer has a single-layer structure including a silicon nitride layer or an organic layer.

12. The display device of claim 6, wherein the passivation layer has a double-layered structure including a lower film comprising silicon nitride and an upper film comprising an organic insulator.

13. The display device of claim 6, wherein the passivation layer and the covering member have a contact hole exposing the drain electrode.

* * * * *